(12) United States Patent
Kancharla et al.

(10) Patent No.: US 11,842,126 B2
(45) Date of Patent: Dec. 12, 2023

(54) SYSTEM FOR GENERATING A HIGH-LEVEL PRODUCT BEHAVIOR DOCUMENT BASED ON EMBEDDED INFORMATION IN FUNCTIONAL BLOCKS EXECUTED DURING RUNTIME OF SOURCE CODE

(71) Applicant: Dell Products L.P., Round Rock, TX (US)

(72) Inventors: Mahesh Kumar Kancharla, Telangana (IN); Suresh Bellary, Karnataka (IN); Vamshi Krishna Shenigaram, Telangana (IN)

(73) Assignee: Dell Products L.P., Round Rock, TX (US)

( * ) Notice: Subject to any disclaimer, the term of this patent is extended or adjusted under 35 U.S.C. 154(b) by 1034 days.

(21) Appl. No.: 16/352,042

(22) Filed: Mar. 13, 2019

(65) Prior Publication Data
US 2020/0293626 A1 Sep. 17, 2020

(51) Int. Cl.
*G06F 8/73* (2018.01)
*G06F 30/20* (2020.01)

(52) U.S. Cl.
CPC ............... *G06F 30/20* (2020.01); *G06F 8/73* (2013.01)

(58) Field of Classification Search
CPC .......... G06F 8/10; G06F 8/73; G06F 11/3476; G06F 11/3612
See application file for complete search history.

(56) References Cited

U.S. PATENT DOCUMENTS

| 11,003,426 B1* | 5/2021 | Wilson | G06F 9/45508 |
| 2004/0181775 A1* | 9/2004 | Anonsen | G06Q 10/10 717/104 |
| 2011/0258611 A1* | 10/2011 | Dutta | G06F 11/3612 717/127 |
| 2013/0030867 A1* | 1/2013 | Wagner | G06Q 30/02 705/26.61 |

OTHER PUBLICATIONS

Doxygen, http://doxygen.nl/, downloaded Feb. 27, 2019.
(Continued)

*Primary Examiner* — Duy Khuong T Nguyen
(74) *Attorney, Agent, or Firm* — Terrile, Cannatti & Chambers; Stephen A. Terrile

(57) ABSTRACT

A method, system and computer-usable medium are disclosed for generating product behavior information based on functional blocks executed from source code at runtime during a product use scenario. Certain embodiments of the method may include: executing source code in a product use scenario, where the source code includes a plurality of functional blocks executed to implement the product use scenario, where the plurality of functional blocks are configured with embedded functional block information; and generating product behavior information for the product use scenario using the embedded functional block information of functional blocks executed during run time of the source code in the product use scenario. In certain embodiments, the product behavior information may be used to generate one or more product behavior documents for one or more of the product use scenarios.

17 Claims, 8 Drawing Sheets

Order Creation - Existing Customer - Success Scenario - Flow Description

1. Receive Order Request:
 a. Read order request message [602]
 b. Extract all the fields to the ordered object [604]

2. Order Request Validations:
 a. Validate payment details received are as per expected payment type and terms [606]
 b. Validate product price is greater than zero [608]

3. Store Order Details:
 a. Stored order header details [702]
  i. Order number
  ii. Customer number
 b. Stored customer contact details received in the order [704]
  i. Bill to address
  ii. Ship to address
  iii. Email ID
  iv. Phone number
 c. Stored the product details ordered [706]
  i. Product name
  ii. Unit price
  iii. Quantity
 d. Store order status as 0 - Ready to Process [708]

4. Process Order Request:
 a. Customer is identified as already existing in system [710]
 b. Update order status to 1 – Processing [712]
 c. Purchasing the products to the customer as part of the order processing [714]
 d. Calculate taxes for the purchased product charges [716]
 e. Update order status to 2 - Successfully processed [718]

5. Order Response:
 a. Prepare Order Response [720]
 b. Deliver Order Response [722]

(56) References Cited

OTHER PUBLICATIONS

Swagger, API Documentation, https://swagger.io/solutions/api-documentation/, downloaded Feb. 27, 2019.
Jacoco, https://www.jacoco.org/jacoco/trunk/doc/mission.html, downloaded Feb. 27, 2019.
Benjamin Brandall, Process.St, 18 Software Documentation Tools That Do the Hard Work for You, https://www.process.st/software-documentation/, Aug. 24, 2016.

* cited by examiner

700 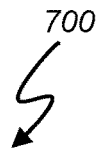

Order Creation - Existing Customer - Success Scenario - Flow Description

1. <u>Receive Order Request:</u>
a. Read order request message [602]
b. Extract all the fields to the ordered object [604]

2. <u>Order Request Validations:</u>
a. Validate payment details received are as per expected payment type and terms [606]
b. Validate product price is greater than zero [608]

3. <u>Store Order Details:</u>
a. Stored order header details [702]
i. Order number
ii. Customer number
b. Stored customer contact details received in the order [704]
i. Bill to address
ii. Ship to address
iii. Email ID
iv. Phone number
c. Stored the product details ordered [706]
i. Product name
ii. Unit price
iii. Quantity
d. Store order status as 0 - Ready to Process [708]

4. <u>Process Order Request:</u>
a. Customer is identified as already existing in system [710]
b. Update order status to 1 – Processing [712]
c. Purchasing the products to the customer as part of the order processing [714]
d. Calculate taxes for the purchased product charges [716]
e. Update order status to 2 - Successfully processed [718]

5. <u>Order Response:</u>
a. Prepare Order Response [720]
b. Deliver Order Response [722]

Figure 7

SYSTEM FOR GENERATING A HIGH-LEVEL PRODUCT BEHAVIOR DOCUMENT BASED ON EMBEDDED INFORMATION IN FUNCTIONAL BLOCKS EXECUTED DURING RUNTIME OF SOURCE CODE

BACKGROUND OF THE INVENTION

Field of the Invention

Embodiments of the invention relate generally to information handling systems. More specifically, embodiments of the invention provide a method and system for generating a high-level product behavior document using information embedded in functional blocks executed during runtime of source code.

Description of the Related Art

As the value and use of information continues to increase, individuals and businesses seek additional ways to process and store information. One option available to users is information handling systems. An information handling system generally processes, compiles, stores, and/or communicates information or data for business, personal, or other purposes thereby allowing users to take advantage of the value of the information. Because technology and information handling needs and requirements vary between different users or applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, airline reservations, enterprise data storage, or global communications.

These same information handling systems have played a key role in implementing automated processes that meet a wide range of business needs. Frequently, there is a disconnect between individuals writing code for the automated processes and individuals designing the business model for such automated processes. Currently, there are no effective means of bridging this disconnect, particularly during development of business process models and corresponding software code.

SUMMARY OF THE INVENTION

A method, system and computer-usable medium are disclosed for generating product behavior information based on functional blocks executed from source code at runtime during a product use scenario. The system may include one or more computers configured to perform particular operations or actions by virtue of having software, firmware, hardware, or a combination of them installed on the system that in operation causes or cause the system to generate product behavior information for source code executed in one or more product use scenarios. Additionally, computer programs can be configured to perform particular operations or actions by virtue of including instructions that, when executed by data processing apparatus, cause the apparatus to generate product behavior information for source code executed in one or more product use scenarios. In certain embodiments, the product behavior information may be used to generate one or more product behavior documents for various product use scenarios.

One general aspect includes a computer-implemented method including: executing source code in a product use scenario, where the source code includes a plurality of functional blocks executed to implement the product use scenario, where the plurality of functional blocks are configured with embedded functional block information; and generating product behavior information for the product use scenario using the embedded functional block information of functional blocks executed during run time of the source code in the product use scenario. In certain embodiments, the product behavior information is used to generate a product behavior document for one or more product use scenarios. Other embodiments of this aspect include corresponding computer systems, apparatus, and computer programs recorded on one or more computer storage devices, each configured to perform the actions of the methods.

Another general aspect includes a system including: a processor, a data bus coupled to the processor, and a non-transitory, computer-readable storage medium embodying computer program code, the non-transitory, computer-readable storage medium being coupled to the data bus, the computer program code interacting with a plurality of computer operations and including instructions executable by the processor and configured for: executing source code in a product use scenario, where the source code includes a plurality of functional blocks executed to implement the product use scenario, where the plurality of functional blocks are configured with embedded functional block information; and generating product behavior information for the product use scenario using the embedded functional block information of functional blocks executed during run time of the source code in the product use scenario. In certain embodiments, the system executes instructions that use the product behavior information to generate a product behavior document for one or more product use scenarios. Other embodiments of this aspect include corresponding computer systems, apparatus, and computer programs recorded on one or more computer storage devices, each configured to perform the actions of the methods.

Another general aspect includes a non-transitory, computer-readable storage medium embodying computer program code, the computer program code including computer executable instructions configured for: executing source code in a product use scenario, where the source code includes a plurality of functional blocks executed to implement the product use scenario, where the plurality of functional blocks are configured with embedded functional block information; and generating product behavior information for the product use scenario using the embedded functional block information of functional blocks executed during run time of the source code in the product use scenario. In certain embodiments, the instructions are executable to use the product behavior information to generate a product behavior document for one or more product use scenarios. Other embodiments of this aspect include corresponding computer systems, apparatus, and computer programs recorded on one or more computer storage devices, each configured to perform the actions of the methods.

BRIEF DESCRIPTION OF THE DRAWINGS

The present invention may be better understood, and its numerous objects, features and advantages made apparent to those skilled in the art by referencing the accompanying drawings. The use of the same reference number throughout the several figures designates a like or similar element.

FIG. 7 illustrates one example of a product behavior document that may be generated in certain embodiments of the disclosed system.

DETAILED DESCRIPTION

Figure 1:
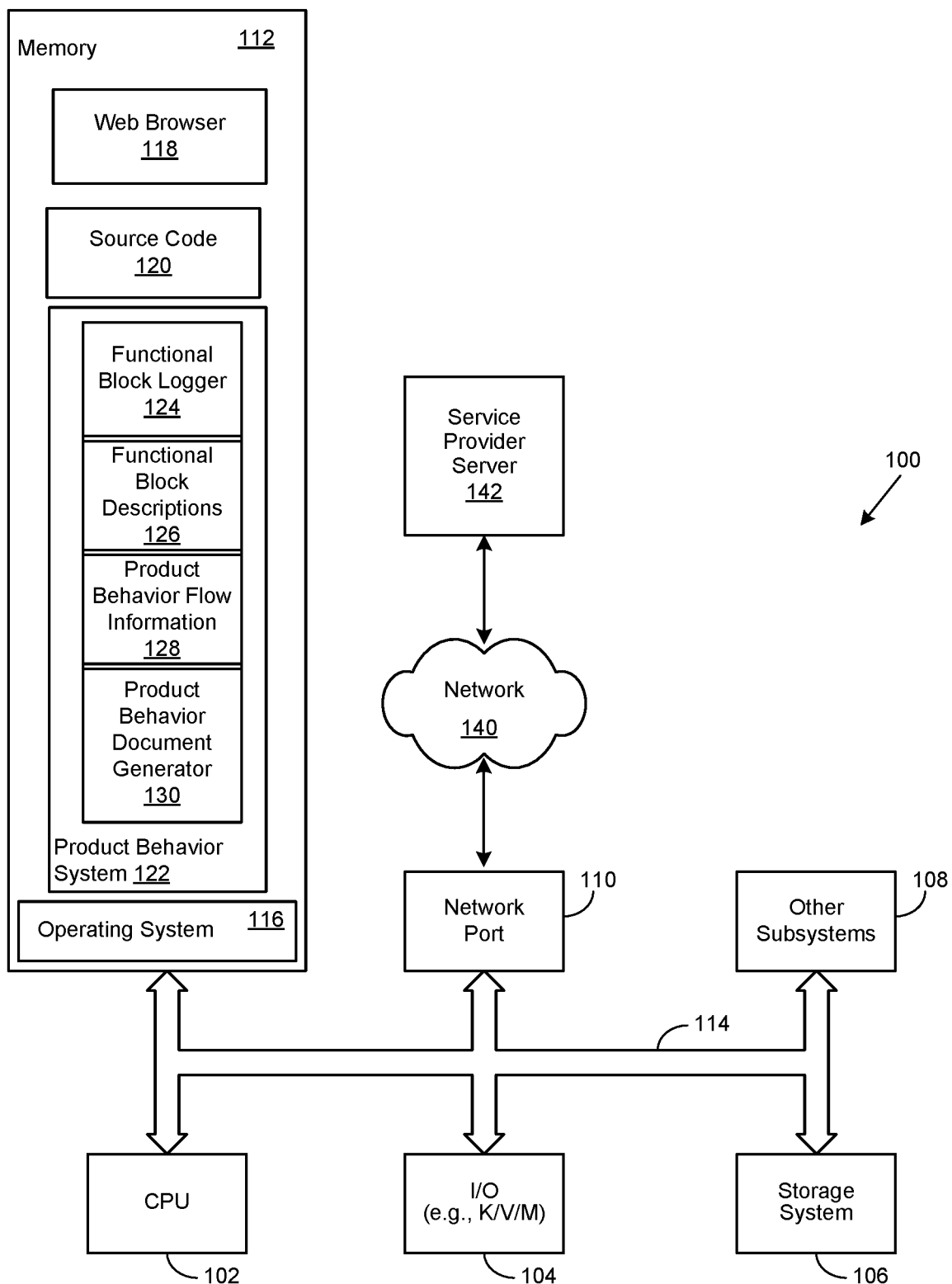
FIG. 1 is a generalized illustration of the components of an information handling system that may be used in the implementation of the system and method of the disclosed system.

A method and system are disclosed for providing documentation identifying product behavior flow for different product use scenario as source code is executed within the product use scenario. As used herein, a product use scenario includes one or more user initiated operations that implement a business process model.

Certain embodiments of the disclosed system generate product behavior information by identifying the flow of processes as the processes occur during execution of source code in one or more product use scenarios. Product behavior information obtained during runtime of the source code may be stored in various manners. Without limitation, the flow of processes executed in the source code for one or more product use scenarios may be stored in a JSON object, text file, etc. Certain embodiments of the disclosed system use the product behavior information to provide a product behavior document providing a high-level view of the flow of processes taking place in one or more product use scenarios. High-level views of the functional flow of operations taking place during a product use scenario may be displayed in a form that is easily read by human users, such as software developers and/or business model developers. Such high-level views of the functional flow provide a useful baseline for cooperation between users having various backgrounds during development of software code and/or business processes. Among other advantages, the disclosed system overcomes many of the technical problems associated with computer source code development for use in defined product use scenarios as well as the use of existing computer source code in the implementation of new product use scenarios. In certain embodiments, the disclosed system allows the computer system to create a product behavior document based on monitoring its own execution of source code at runtime in one or more product use scenarios.

Certain aspects of the disclosed system employ information handling systems. For purposes of this disclosure, an information handling system may include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, or other purposes. For example, an information handling system may be a personal computer, a network storage device, or any other suitable device and may vary in size, shape, performance, functionality, and price. The information handling system may include random access memory (RAM), one or more processing resources such as a central processing unit (CPU) or hardware or software control logic, ROM, and/or other types of nonvolatile memory. Additional components of the information handling system may include one or more disk drives, one or more network ports for communicating with external devices as well as various input and output (I/O) devices, such as a keyboard, a mouse, and a video display. The information handling system may also include one or more buses operable to transmit communications between the various hardware components.

The flowchart and block diagrams in the figures illustrate the architecture, functionality, and operation of possible implementations of systems, methods, and computer program products according to various embodiments of the disclosed system. In this regard, each block in the flowchart or block diagrams may represent a sub-system, module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

FIG. 1 is a generalized illustration of an information handling system 100 that can be used to implement the system and method of the disclosed system. The information handling system 100 includes a processor (e.g., central processor unit or "CPU") 102, input/output (I/O) devices 104, such as a display, a keyboard, a mouse, and associated controllers, a hard drive or disk storage 106, and various other subsystems 108. In various embodiments, the information handling system 100 also includes network port 110 operable to connect to a network 140, which is likewise accessible by a service provider server 142. The information handling system 100 likewise includes system memory 112, which is interconnected to the foregoing via one or more buses 114. System memory 112 further comprises operating system (OS) 116 and in various embodiments may also comprise a web browser 118.

Certain embodiments of the system 100 include source code 120 configured for executing a plurality of operations that are used in the implementation of various product use scenarios. In certain embodiments, the source code 120 is in the form of a plurality of the executable functional blocks. In certain embodiments, the functional blocks are configured with embedded functional block information that may be used to trace, for example, which functional blocks are executed by the source code 120 in various product use scenarios.

Certain embodiments also include a product behavior system 122 configured to provide a user with an easy to understand high-level view of functions executed by the source code 120 in various product use scenarios. The example of the product behavior system 122 shown in FIG. 1 includes a functional block logger 124, which is configured to use the embedded functional block information of the functional blocks executed during runtime of the source code 120 in a product use scenario. In certain embodiments, the information needed to describe the operation of a functional block may be included in the embedded information of the functional block. Additionally, or in the alternative, certain embodiments may map the embedded information of the functional block to functional block descriptions in a pre-configured document object 126.

In certain embodiments, the description of the functional blocks executed in the source code 120 at runtime in a product use scenario are used to generate product behavior flow information 128, as described herein. The behavior flow information 128 may take on any number of different formats. In certain embodiments, the product behavior flow information 128 may be stored as a database object, document object, spreadsheet, etc. in certain embodiments, the product behavior flow information 128 is used by a product behavior document generator 130 to generate a product behavior document providing a user with a high-level view of the functions executed in a product use scenario. In certain embodiments, the product behavior document may be generated as one or more HTML pages for display to a user by the web browser 118. In certain embodiments, the product behavior document generator 130 may be provided with pre-configured templates that automatically choose the product behavior document format that is to be used by the product behavior document generator 130. In certain embodiments, the product behavior document generator 130 may respond to a user query of the product behavior flow information 128. In certain embodiments, the results of the query may be used by the product behavior document generator 130 to generate the product behavior document. In certain embodiments, the user may query the product behavior flow information 128 to return functional flow information for a particular product use scenario. In certain embodiments, the user may query the product behavior flow information 128 to identify which product use scenarios execute particular functional blocks of the source code 120.

In one embodiment, the information handling system 100 is able to download the product behavior system 122 from a service provider server 142. In another embodiment, the product behavior system 122 may be provided as a service from the service provider server 142.

Figure 2:
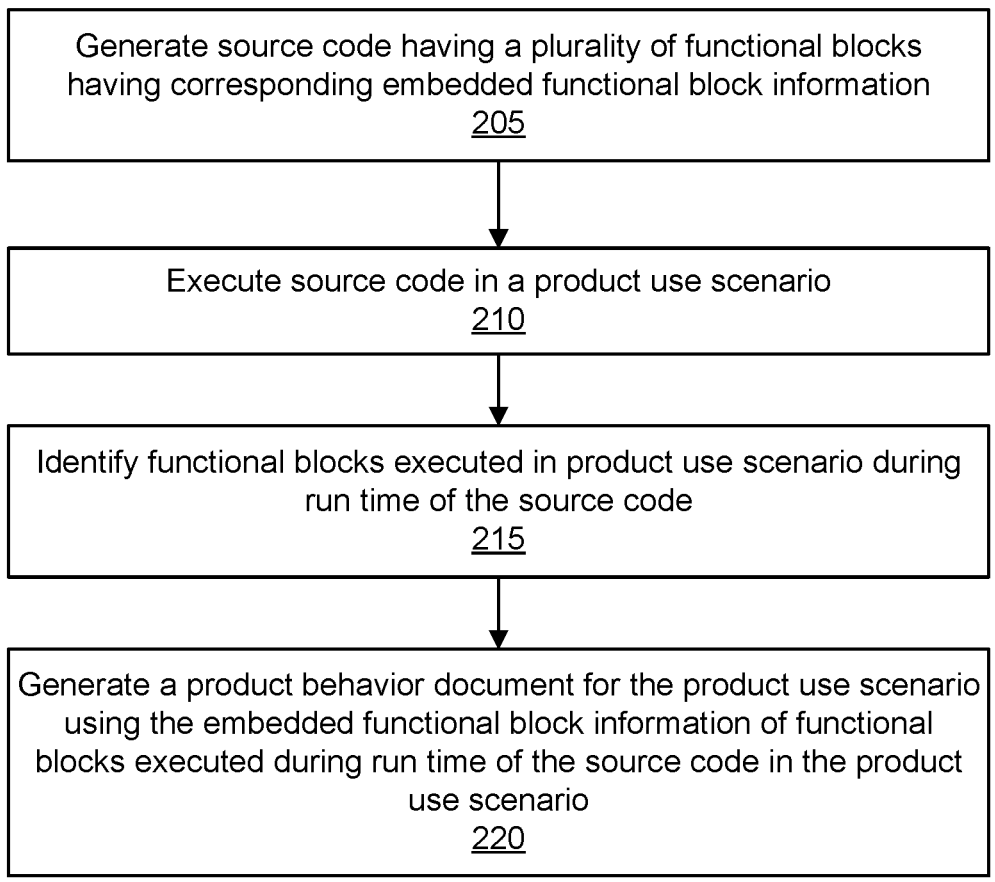
FIG. 2 is a flowchart depicting exemplary operations that may be used to implement certain embodiments of the disclosed system.

FIG. 2 is a flowchart depicting exemplary operations that may be used to implement certain embodiments of the invention. In the example shown in FIG. 2, source code is generated at operation 205 by, for example, one or more software developers. Although other programming languages may be used, the examples will be described in the context of source code written using the Java programming language.

When a software developer writes source code, the developer typically writes the source code is a plurality of functional blocks that are called when the source code is executed to implement a product use scenario. In accordance with the disclosed system, the functional blocks include embedded functional block information that may be used to identify and/or describe the functional block when the functional block is executed during a product use scenario. In certain embodiments, the embedded functional block information may include a functional block identifier, which is unique to the functional block. In certain embodiments, the embedded functional block information may include a description of the operations implemented by the functional block. It will be understood, in view of the teachings of the disclosed system, that the embedded information may include any information that a system designer wishes to use in the generation of a product behavior document.

In the illustrated example, the source code is executed at operation 210 in a product use scenario. In certain embodiments, the product use scenario may be executed pursuant to debugging the source code. In certain embodiments, the product use scenario may be executed to generate a product behavior document that is specific to the product use scenario. It will be recognized, in view of the present disclosure, that a variety of situations exist in which execution of the source code in a given product use scenario to generate product behavior information for that scenario is desirable.

During runtime of the source code in the product use scenario, the functional blocks executed in the product use scenario are identified at operation 215 using the embedded functional information. At operation 220, a product behavior document for the product use scenario is generated based directly and/or indirectly on the embedded functional information of functional blocks executed during the scenario.

Figure 3:
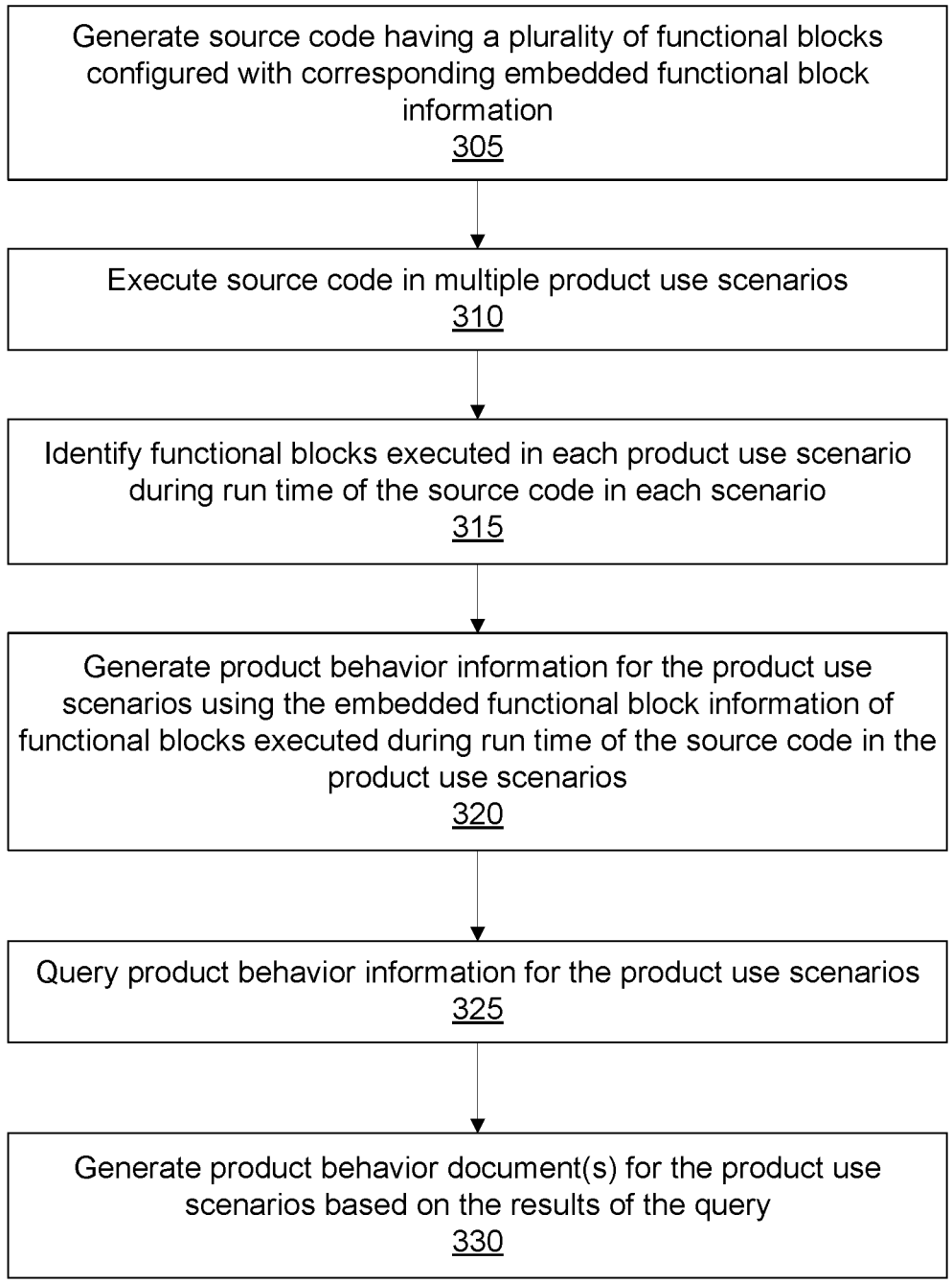
FIG. 3 is another flowchart depicting exemplary operations that may be used to implement certain embodiments of the disclosed system.

FIG. 3 is another flowchart depicting exemplary operations that may be used to implement certain embodiments of the disclosed system. In this example, product behavior information is generated for one or more product use scenarios and queried to generate one or more product behavior documents for those scenarios.

In the example shown in FIG. 3, source code having a plurality of functional blocks is generated at operation 305. The plurality of functional blocks may be configured with corresponding embedded functional block information.

In certain embodiments, the source code is executed in multiple product use scenarios at operation 310. At operation 315, the functional blocks executed in each product use scenario are identified during runtime of the source code for each scenario. In certain embodiments, product behavior information for each of the product use scenarios is generated at operation 320 using the embedded functional block information of the functional blocks executed during runtime of the source code in each of the product scenarios. In certain embodiments, the product behavior information for the product use scenarios is queried at operation 325. The nature of the query is a matter of design choice. In certain embodiments, the specific information queried in the product behavior information may be entered directly in text fields by the user or selected from a set of predetermined queries presented to the user on a user interface, such as a display.

In certain embodiments, the user may query the product behavior information to show the flow of functional blocks that are executed during one or more queried product use scenarios. In certain embodiments, the user may query the product behavior information to identify the product use scenarios that use a queried functional block. It will be recognized by those skilled in the art, based on the teachings of the present disclosure, that the queries formulated to obtain product behavior information showing process flows, product use scenarios, etc. may be a matter of design choice. In certain embodiments, product behavior documents for one or more of the product use scenarios are generated at operation 330 based on the results of the query. The product behavior documents may be presented to a user to easily identify functional operations that take place in the source code during various product use scenarios.

Figure 4:
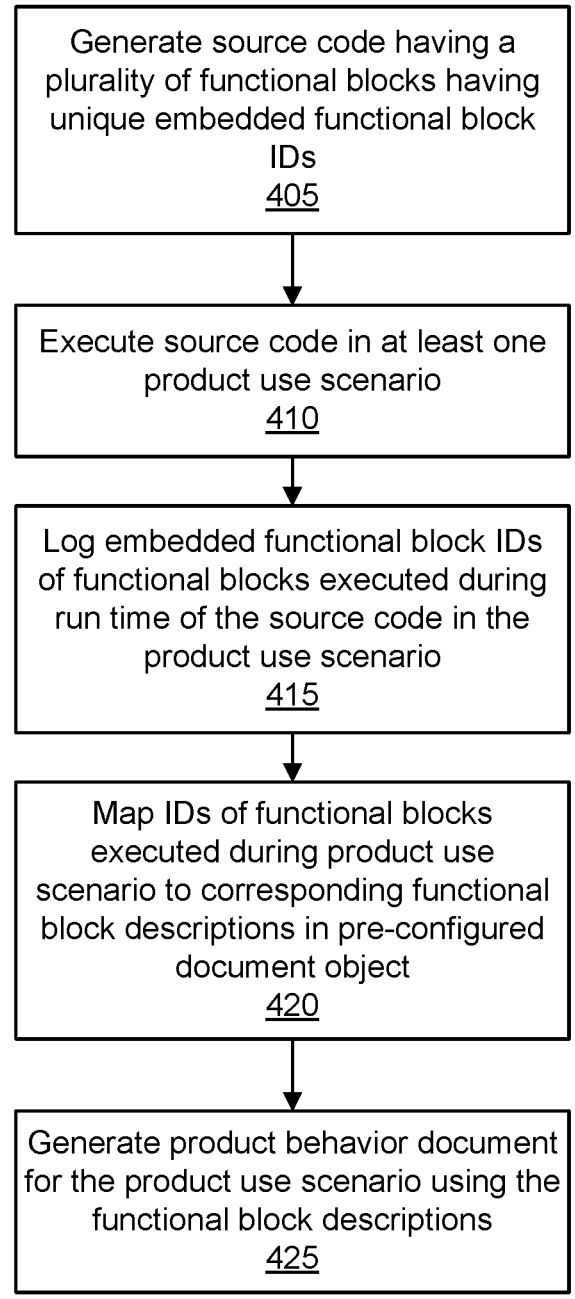
FIG. 4 is another flowchart depicting exemplary operations that may be used to implement certain embodiments of the disclosed system.

FIG. 4 is another flowchart depicting exemplary operations that may be used to implement certain embodiments of the disclosed system. Generally stated, the example shown in FIG. 4 employs embedded functional block IDs that are logged at runtime and then mapped to functional block descriptions in one or more pre-configured document objects.

As shown in FIG. 4, certain embodiments employ source code generated at operation 405. In certain embodiments, the source code includes a plurality of functional blocks having unique embedded functional block IDs. In certain embodiments, the embedded functional block IDs may be formatted as one or more alphanumeric string characters. In certain embodiments, the embedded functional block IDs may be formatted as a binary, actual, or hexadecimal number. As will be understood by those skilled in the art in view of the present disclosure, the format of the functional IDs may be a matter of design choice.

In certain embodiments, the source code is executed at operation 410 in one or more product use scenarios. As the source code is executed, the embedded functional block IDs for the functional blocks executed during runtime of the source code in the use scenario are logged at operation 415.

Certain embodiments, such as the example shown in FIG. 4, utilize a preconfigured document object, such as a JSON object, text file, etc., in the product behavior document generation process. In certain embodiments, the preconfigured document object includes a high-level description of the operations executed by specific functional blocks of the source code as well as the unique functional ID associated with the functional block. In certain embodiments, the preconfigured document object includes a high-level description for all functional blocks included in the source code. In certain embodiments, the preconfigured document object only includes high-level descriptions of functional blocks that the source code developer anticipates will be executed in one or more product use scenarios.

In certain embodiments, the functional block IDs that are logged at operation 415 are mapped to the corresponding functional block descriptions in the pre-configured document object at operation 420. In certain embodiments, all of the embedded functional block IDs that are logged during runtime may be stored as a log file or other log object, etc., upon completion of the product use scenario and subsequently mapped at operation 420. In certain embodiments, the functional block IDs may be mapped at operation 420 as execution of the corresponding functional block is logged at operation 415 during the product use scenario.

In certain embodiments, a product behavior document for the product use scenario is generated at operation 425 using the high-level functional block descriptions obtained during the mapping steps of operation 420. In certain embodiments, the product behavior document may be generated dynamically as the functional block IDs are mapped to the corresponding high-level functional block descriptions at operation 420. In certain embodiments, the product behavior document may be generated using the log object in a batch-like operation once all of the functional blocks have been executed for the product use scenario. It will be recognized, based on the teachings of the present disclosure, that there are various manners of implementing the processes executed in operations 415, 420, and 425, and that the invention is not limited to the foregoing examples.

Figure 5A:
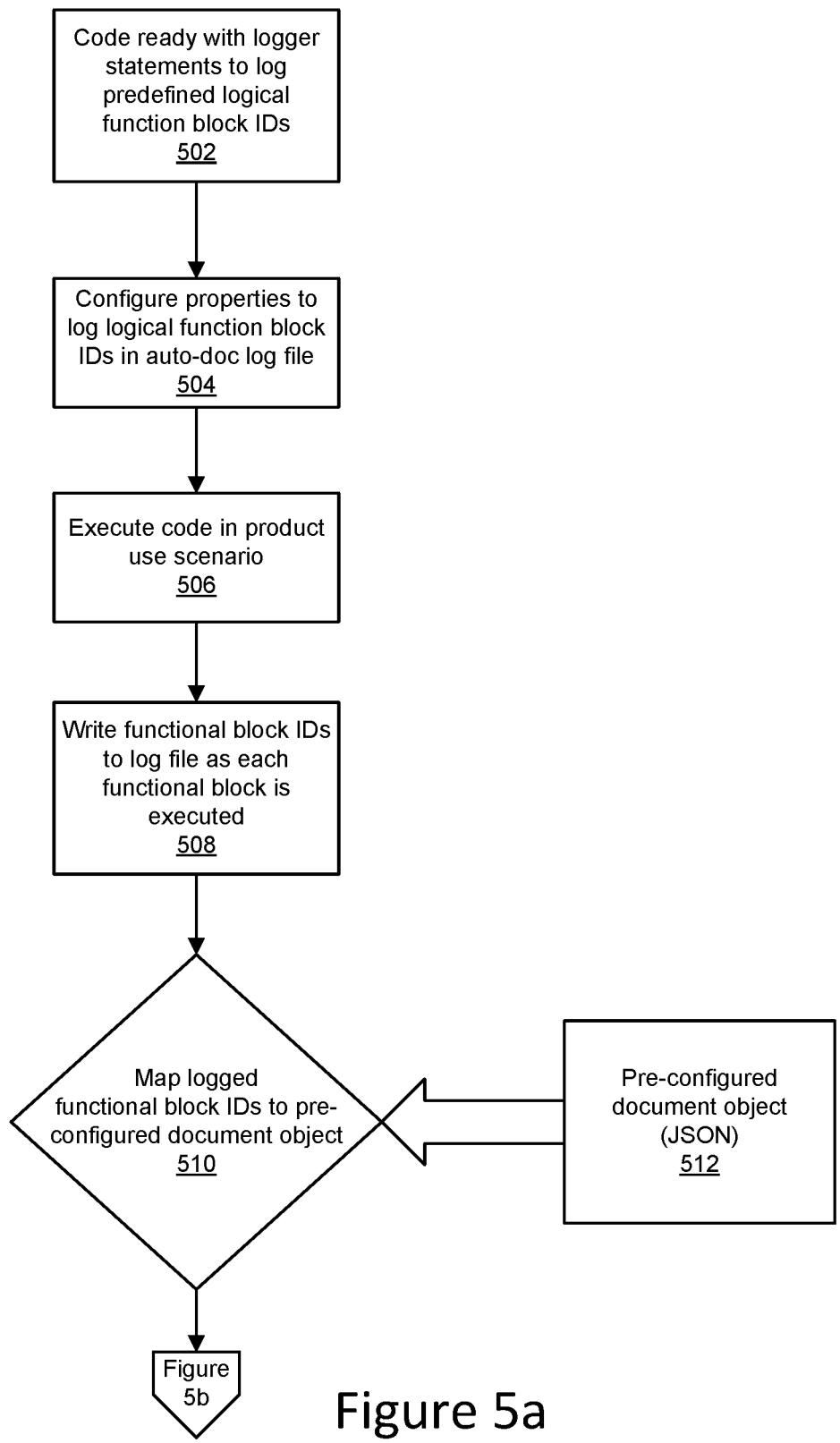
FIGS. 5a and 5b (collectively "FIG. 5") depict another flowchart showing exemplary operations that may be used to implement certain embodiments of the disclosed system.
Figure 5B:
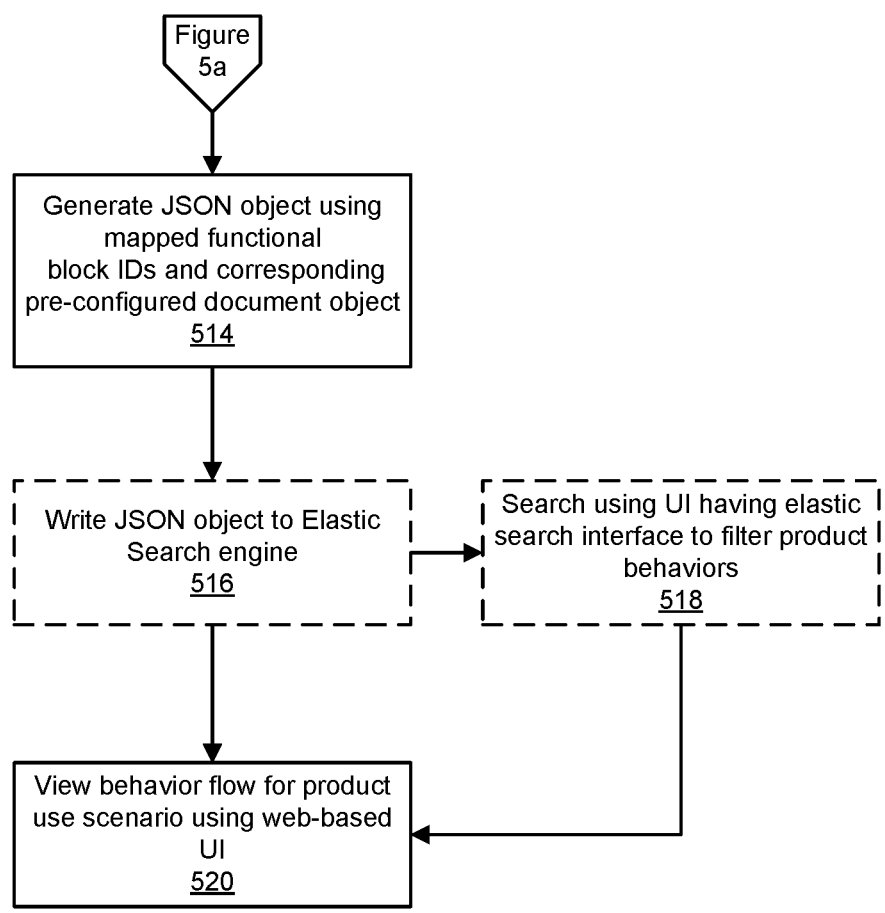

FIGS. 5a and 5b (collectively "FIG. 5") depict another flowchart showing exemplary operations that may be used to implement certain embodiments of the disclosed system. Although the operations shown in FIG. 5 are applicable to implementation in various programming languages, the illustrated example is readily adapted for implementation using a scripting language, such as Java.

In FIG. 5, source code is provided at operation 502. In certain embodiments, the source code is provided with logger statements to log predefined logical function block IDs embedded in functional blocks of the source code. At operation 504, certain embodiments configure properties to log the logical function block IDs using, for example, code included in the source file itself. Additionally, or on the alternative, the properties may be defined in a configuration file that is distinct from the source code. In certain embodiments, the properties are configured to allow the source code to log functional block IDs in an auto-doc log file as the corresponding functional block is executed at runtime. In certain embodiments, the source code is executed in a product use scenario at operation 506. At operation 508, certain embodiments write the logical function IDs to the auto-doc log file as each functional block of the source code is executed in the product use scenario.

The example shown in FIG. 5 employs a pre-configured document object 512, such as a JSON file. In certain embodiments, the pre-configured document object 512 includes functional block IDs that are directly correlated with the functional block IDs in the source code. In certain embodiments, the same functional block IDs are used in both the source code and the pre-configured document object 512. Such correlation allows the functional block IDs in the source code to be mapped to the functional block IDs in the pre-configured document object 512. In certain embodiments, the functional block IDs in the pre-configured document object include high-level descriptions of the operations executed by the corresponding functional block ID in the source code. As an example, functional block ID "AAA" in the source code may be mapped to functional block ID "AAA" in the pre-configured document object 512. To extend this example, the portion of the pre-configured document object 512 associated with the functional block ID "AAA" may include, for example, text or other objects describing the high-level operations that occur when the functional block ID "AAA" is executed in the source code.

In certain embodiments, the functional block IDs logged at operation 508 are mapped to the corresponding functional block IDs in the pre-configured document object 512 at a mapping operations 510. In certain embodiments, the mapping operations 510 are used to generate product behavior object, such as a JSON object, that includes product behavior information for the product use scenario. In certain embodiments, the JSON document includes the functional block ID of each functional block executed during the product use scenario and the description of the functional block ID included in the pre-configured document. In certain embodiments, the functional block IDs may be stored in the document object in the order in which the functional block IDs were logged in operation 508.

In certain embodiments, the product behavior object generated at operation 514 may be accessed directly, without further manipulation of the, for viewing the behavior flow for the product use scenario using, for example, a web-based user interface at operation 520. As an example, a JSON object including the product behavior information in one or more product use scenarios may be displayed as a product behavior document through a web browser (see, e.g., web browser 118 of FIG. 1).

In certain embodiments, the product behavior object generated at operation 514 may be stored at operation 516 to a search engine, such as an Elastic Search engine. In certain embodiments, a user interface may be provided to a software and/or business operations developer to query the product behavior information at operation 518 using the Elastic Search engine. In certain embodiments, the result of the search may be presented at operation 520 as a product behavior document at, for example, a web-based user interface.

Figure 6:
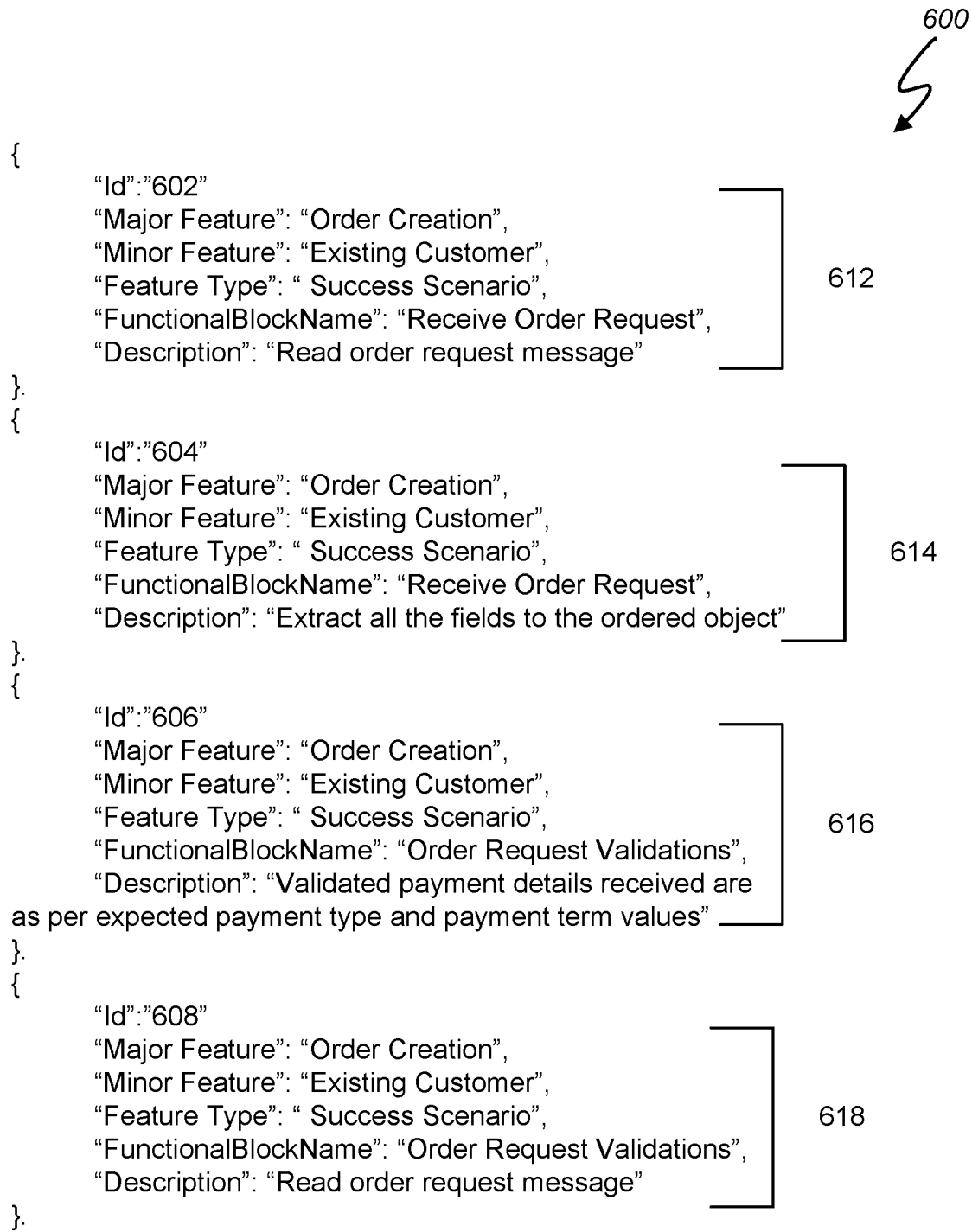
FIG. 6 shows an example of a pre-configured document object that may be used in certain embodiments of the disclosed system.

FIG. 6 shows an example of a pre-configured document object 600 that may be used to implement certain embodiments of the disclosed system. In this particular example, the pre-configured document object 600 includes at least four functional block IDs 602, 604, 606, and 608 with corresponding high-level functional descriptions 612, 614, 616, and 618. However, it will be recognized by those skilled in the art, in view of the teachings of the present disclosure, that the pre-configured document object 600 is likely to include a substantial number of additional functional block IDs and corresponding functional descriptions since the source code is often designed for implementing a wide range of product use scenarios requiring execution of more functional blocks than shown in this example. As an example, certain functional blocks of the source code may be executed in a first product scenario, while some of the same and/or different functional blocks may be executed in a second product scenario. In certain embodiments, the pre-configured document object 600 may include functional block IDs and corresponding functional descriptions of all, or substantially all, of the functional blocks executed in both the first and second product use scenarios. It will be recognized by those skilled in the art, based on the teachings of the present disclosure, that the determination of which functional descriptions are provided in the pre-configured document object 600 is a matter of design choice and based on the types and extent of high-level functions that are to be included in the product behavior document for one or product use scenarios.

The exemplary functional block IDs of FIG. 6 show high-level functional operations for functional blocks executed in a product use scenario in which an order for a product is created. In certain embodiments, the functional descriptions associated with each functional block ID may include descriptions that can be arranged in a hierarchical manner for display to a user. In certain embodiments, the descriptions are arranged in a hierarchical manner within the pre-configured document object 600. In the examples shown in FIG. 7, each of the functional block IDs of the pre-configured document object 600 include a "Major Feature," a "Minor Feature," a "Feature Type," a "FunctionalBlock-Name," and a "Description."

In certain embodiments, the "Major Feature" may be used to describe the general product use scenario with which the functional block ID is associated. In this example, functional block IDs 602-608 are associated with a common "Order Creation" use scenario. In certain embodiments, the "Minor Feature" may be used to describe a sub-group of the "Major Feature" for the functional block ID. In this example, functional block IDs 602-608 have a common "Minor Feature" of "Existing Customer," indicating that the corresponding functional blocks are dealing with an existing customer, as opposed to a new customer, where additional operations may be required to complete a new customer order. In certain embodiments, the "Feature Type" may be used to describe a particular outcome associated with the execution of the functional ID in the product use scenario. In this example, the "Feature Type" is a "Success Scenario," indicating that the functional blocks in the source code that correspond to the functional block IDs 602-608 are invoked when the product use scenario is successful. In certain embodiments, the "FunctionalBlockName" may be used to describe a specific operating context in which the functional block ID is executed in the product use scenario. In the example shown here, functional block IDs 602 and 604 are associated with operations in which a system receives order requests from the user in the product use scenario. Also, in the example shown here, functional block IDs 606 and 608 are associated with operations in which the system validates order requests received from the user in the product use scenario. In certain embodiments, the "Description" includes a specific operation executed by the functional block ID. In this example, the description associated functional block ID 602 is "Read order request message." The description associated with functional block ID 604 is "Extract all fields to the ordered object." The description associated with functional block ID 606 is "Validated payment details received are as per expected payment type and payment term values." And, the description associated with functional block ID 608 is "Read order request message."

FIG. 7 illustrates one example of a product behavior document that may be generated in certain embodiments of the disclosed system. In this example, the product flow for a successful order creation for an existing customer is shown. Here, the functional blocks invoked in the source code during runtime in this product use scenario have been logged and mapped to functional block information in the pre-configured document object 600. In this example, the high-level operations executed by the functional blocks of the source code are shown in a hierarchical manner in the product behavior document. In certain embodiments, the product behavior document also includes the functional IDs executed in the source code.

In this example, item 1 of the product behavior document has the title "Received Order Request." Functional block IDs 602 and 604 correspond to the functional blocks executed in the source code when executing a "Received Order Request." A high-level description of the operation executed in the source code with respect to functional block ID 602 is presented at item 1.*a*—"Read order request message." A high-level description of the operation executed in the source code with respect to functional block ID 604 is presented at item 1.*b*—"Read order request message."

To continue this example, item 2 of the product behavior document has the title "Order Request Validations." Functional block IDs 606 and 608 correspond to the functional blocks executed in the source code when executing operations to validate an order. A high-level description of the operation executed in the source code with respect to functional block ID 606 is presented at item 2.*a*—"Validate payment details received are as per expected payment type and terms." A high-level description of the operation executed in the source code with respect to functional block ID 608 is presented at item 2.*b*—"Validate product price is greater than zero."

The exemplary product behavior document 700 shown in FIG. 7 also displays additional operations executed in the source code in the illustrated product use scenarios. It will be understood by those skilled in the art, in view of the teachings of the present disclosure, that these additional functional block IDs and corresponding descriptions can be readily added to the pre-configured document object 600 shown in FIG. 6.

In this example, item 3 of the product behavior document 700 relates to operations executed in the context of storing order details. During this operation, functional block IDs 702, 704, 706, and 708 have been executed in the source code. Accordingly, the descriptions of functional block IDs 702, 704, 706, and 708 have been added to the product behavior document 700 as operations that are hierarchical subsidiaries to the more general context of storing order details.

Further, in this example, item 4 relates to operations executed in the context of processing an order request. During this operation, functional block IDs 710, 712, 714, 716, and 718 have been executed in the source code. Accordingly, the descriptions of functional block IDs 710, 712, 714, 716, and 718 have been added to the product behavior document 700 as operations that are hierarchical subsidiaries in the more general context of processing an order request.

Still further, in this example, item 5 relates to operations for preparing and delivering an order response. During this operation, functional block IDs 720 and 722 have been executed in the source code. Accordingly, the descriptions of functional block IDs 720 and 722 have been added to the product behavior document 700 as operations that are hierarchical subsidiaries to the more general context of preparing and delivering an order response.

The present invention is well adapted to attain the advantages mentioned as well as others inherent therein. While the present invention has been depicted, described, and is defined by reference to particular embodiments of the invention, such references do not imply a limitation on the invention, and no such limitation is to be inferred. The invention is capable of considerable modification, alteration, and equivalents in form and function, as will occur to those ordinarily skilled in the pertinent arts. The depicted and described embodiments are examples only, and are not exhaustive of the scope of the invention.

For example, the above-discussed embodiments include software modules that perform certain tasks. The software modules discussed herein may include script, batch, or other executable files. The software modules may be stored on a machine-readable or computer-readable storage medium such as a disk drive. Storage devices used for storing software modules in accordance with an embodiment of the invention may be magnetic floppy disks, hard disks, or optical discs such as CD-ROMs or CD-Rs, for example. A storage device used for storing firmware or hardware modules in accordance with an embodiment of the invention may also include a semiconductor-based memory, which may be permanently, removably or remotely coupled to a microprocessor/memory system. Thus, the modules may be stored within a computer system memory to configure the computer system to perform the functions of the module. Other new and various types of computer-readable storage media may be used to store the modules discussed herein. Additionally, those skilled in the art will recognize that the separation of functionality into modules is for illustrative purposes. Alternative embodiments may merge the functionality of multiple modules into a single module or may impose an alternate decomposition of functionality of modules. For example, a software module for calling sub-modules may be decomposed so that each sub-module performs its function and passes control directly to another sub-module. Consequently, the invention is intended to be limited only by the spirit and scope of the appended claims, giving full cognizance to equivalents in all respects.

What is claimed is:

1. A computer-implemented method comprising:
executing source code in a product use scenario, the product use scenario comprising a user initiated operation that implements a business process model, wherein the source code includes a plurality of functional blocks executed to implement the product use scenario, wherein the plurality of functional blocks are configured with embedded functional block information, the embedded functional block information for the functional block including a functional block identifier, the functional block identifier being unique to the functional block, the embedded functional block information including a description of operations implemented by the functional block, the description of operations implemented by the functional block including information for use when generating product behavior information for the product use scenario;
generating product behavior information for the product use scenario using the embedded functional block information of functional blocks executed during run time of the source code in the product use scenario, the generating the product behavior information includes logging the functional block identifier as the corresponding functional block is executed during the product use scenario and mapping the logged functional block identifiers to corresponding functional block descriptions stored in a pre-configured document object and,
using the product behavior information to generate a product behavior document for display to a user, wherein the product behavior document displays human readable functional flow information corresponding to a sequence in which the plurality of functional blocks are executed during run time of the source code in the product use scenario.

2. The computer-implemented method of claim 1, wherein generation of the product behavior information further comprises:
generating the product behavior information using the functional block descriptions.

3. The computer-implemented method of claim 2, wherein
the functional block description for the corresponding functional block includes a plurality of fields configured with a hierarchical organization of characteristics of the functional block.

4. The computer-implemented method of claim 3, further comprising:
displaying the embedded functional block information of functional blocks executed during run time of the source code in the product use scenario in a hierarchical format based on the hierarchical organization of characteristics of the functional blocks executed during run time.

5. The computer-implemented method of claim 1, wherein the generation of the product behavior document for the product use scenario includes:
executing the source code in a plurality of different product use scenarios;
determining which functional blocks are executed in each of the plurality of different product use scenarios by logging which of the functional block identifiers are invoked during run time execution of the source code in the plurality of different product use scenarios; and
generating the product behavior document for each of the plurality of different product use scenarios based on the logged functional block identifiers.

6. The computer-implemented method of claim 1, further comprising:
executing a query of the product behavior information to identify product behaviors for specific product use scenarios; and using results of the query to generate the product behavior document.

7. A system comprising:
a processor;
a data bus coupled to the processor; and
a non-transitory, computer-readable storage medium embodying computer program code, the non-transitory, computer-readable storage medium being coupled to the data bus, the computer program code interacting with a plurality of computer operations and comprising instructions executable by the processor and configured for:
executing source code in a product use scenario, the product use scenario comprising a user initiated operation that implements a business process model, wherein the source code includes a plurality of functional blocks executed to implement the product use scenario, wherein the plurality of functional blocks are configured with embedded functional block information, the embedded functional block information for the functional block including a functional block identifier, the functional block identifier being unique to the functional block, the embedded functional block information including a description of operations implemented by the functional block, the description of operations implemented by the functional block including information for use when generating product behavior information for the product use scenario;
generating product behavior information for the product use scenario using the embedded functional block information of functional blocks executed during run time of the source code in the product use scenario, the generating the product behavior information includes logging the functional block identifier as the corresponding functional block is executed during the product use scenario and mapping the logged functional block identifiers to corresponding functional block descriptions stored in a pre-configured document object and,
using the product behavior information to generate a product behavior document for display to a user, wherein the product behavior document displays human readable functional flow information corresponding to a sequence in which the plurality of functional blocks are executed during run time of the source code in the product use scenario.

8. The system of claim 7, wherein generation of the product behavior information further comprises:
generating the product behavior information using the functional block descriptions.

9. The system of claim 8, wherein
the functional block descriptions for the corresponding functional block include a plurality of fields configured with a hierarchical organization of characteristics of the functional block.

10. The system of claim 9, wherein the instructions are further configured for:
displaying a description of functional blocks executed during run time of the source code in the product use scenario in a hierarchical format based on the hierarchical organization of characteristics of the functional blocks executed during run time.

11. The system of claim 7, wherein the generation of the product behavior document for the product use scenario includes:
executing the source code in a plurality of different product use scenarios;
determining which functional blocks are executed in each of the plurality of different product use scenarios by logging which of the functional block identifiers are invoked during run time execution of the source code in the plurality of different product use scenarios; and
generating the product behavior document for each of the plurality of different product use scenarios based on the logged functional block identifiers.

12. The system of claim 7, wherein the instructions are further configured for:
executing a query of the product behavior information to identify product behaviors for specific product use scenarios; and
using results of the query to generate the product behavior document.

13. A non-transitory, computer-readable storage medium embodying computer program code, the computer program code comprising computer executable instructions configured for:
executing source code in a product use scenario, the product use scenario comprising a user initiated operation that implements a business process model, wherein the source code includes a plurality of functional blocks executed to implement the product use scenario, wherein the plurality of functional blocks are configured with embedded functional block information, the embedded functional block information for the functional block including a functional block identifier, the functional block identifier being unique to the functional block, the embedded functional block information including a description of operations implemented by the functional block, the description of operations implemented by the functional block including information for use when generating product behavior information for the product use scenario;
generating product behavior information for the product use scenario using the embedded functional block information of functional blocks executed during run time of the source code in the product use scenario, the generating the product behavior information includes logging the functional block identifier as the corresponding functional block is executed during the product use scenario and mapping the logged functional block identifiers to corresponding functional block descriptions stored in a pre-configured document object and,
using the product behavior information to generate a product behavior document for display to a user, wherein the product behavior document displays human readable functional flow information corresponding to a sequence in which the plurality of functional blocks are executed during run time of the source code in the product use scenario.

14. The non-transitory, computer-readable storage medium of claim 13, wherein
generation of the product behavior information further comprises:
generating the product behavior information using the functional block descriptions.

15. The non-transitory, computer-readable storage medium of claim 14, wherein
the functional block descriptions for the corresponding functional block include a plurality of fields configured with a hierarchical organization of characteristics of the functional block.

16. The non-transitory, computer-readable storage medium of claim 15, wherein the instructions are further configured for:
  displaying a description of functional blocks executed during run time of the source code in the product use scenario in a hierarchical format based on the hierarchical organization of characteristics of the functional blocks executed during run time.

17. The non-transitory, computer-readable storage medium of claim 13, wherein the instructions are further configured for:
  executing a query of the product behavior information to identify product behaviors for specific product use scenarios; and
  using results of the query to generate the product behavior document.

\* \* \* \* \*